(12) United States Patent
Raberg et al.

(10) Patent No.: US 10,008,225 B2
(45) Date of Patent: Jun. 26, 2018

(54) MAGNETIC SENSOR DEVICE HAVING A MAGNETO-RESISTIVE STRUCTURE THAT GENERATES A VORTEX MAGNETIZATION PATTERN

(71) Applicant: Infineon Technologies AG, Neubiberg (DE)

(72) Inventors: Wolfgang Raberg, Sauerlach (DE); Tobias Wurft, München (DE)

(73) Assignee: Infineon Technologies AG, Neubiberg (DE)

( * ) Notice: Subject to any disclaimer, the term of this patent is extended or adjusted under 35 U.S.C. 154(b) by 0 days. days.

(21) Appl. No.: 15/360,079

(22) Filed: Nov. 23, 2016

(65) Prior Publication Data

US 2017/0168122 A1    Jun. 15, 2017

(30) Foreign Application Priority Data

Dec. 14, 2015  (DE) ......................... 10 2015 121 753

(51) Int. Cl.
| | |
|---|---|
| *G11B 5/39* | (2006.01) |
| *G01R 33/09* | (2006.01) |
| *H01F 10/32* | (2006.01) |
| *G01R 33/00* | (2006.01) |

(52) U.S. Cl.
CPC .......... *G11B 5/398* (2013.01); *G01R 33/0023* (2013.01); *G01R 33/09* (2013.01); *H01F 10/324* (2013.01); *G11B 2005/3996* (2013.01)

(58) Field of Classification Search
None
See application file for complete search history.

(56) References Cited

U.S. PATENT DOCUMENTS

| | | |
|---|---|---|
| 7,057,862 B2 | 6/2006 | Kasiraj et al. |
| 7,697,243 B1 | 4/2010 | Novosad et al. |
| 2005/0174701 A1 | 8/2005 | Kasiraj et al. |
| 2006/0291108 A1 | 12/2006 | Sbiaa et al. |
| 2008/0180865 A1 | 7/2008 | Min et al. |
| 2009/0302403 A1 | 12/2009 | Nguyen |
| 2012/0326713 A1 | 12/2012 | Zimmer et al. |

(Continued)

FOREIGN PATENT DOCUMENTS

| | | |
|---|---|---|
| JP | 2005-535115 | 11/2005 |
| JP | 2009-175120 | 8/2009 |

OTHER PUBLICATIONS

Meng Zhu et al., "Vortex state formation and stability in single and double layer nanorings and nanodisks," http://dx.doi.org/10.1063/1.4798247, Apr. 2, 2013, 4 pages.

(Continued)

*Primary Examiner* — Craig A. Renner
(74) *Attorney, Agent, or Firm* — Harrity & Harrity, LLP

(57) ABSTRACT

An embodiment relates to a magnetic sensor device, comprising a magneto-resistive structure. The magneto-resistive structure comprises a magnetic free layer configured to spontaneously generate a closed flux magnetization pattern in the magnetic free layer. The magneto-resistive structure also comprises a magnetic reference layer having a non-closed flux reference magnetization pattern. The magnetic sensor device further comprises a magnetic biasing structure configured to generate a biasing field in the magnetic free layer, the biasing field having a non-zero magnetic biasing field component perpendicular to the reference magnetization pattern.

18 Claims, 11 Drawing Sheets

(56) References Cited

U.S. PATENT DOCUMENTS

2013/0116943 A1    5/2013    Pant et al.
2015/0185297 A1    7/2015    Zimmer et al.

OTHER PUBLICATIONS

M. Schneider et al., "Stability of magnetic vortices in flat submicron permalloy cylinders," http://dx.doi.org/10.1063/1.1490623, Aug. 1, 2002, 8 pages.

J. Sort et al., "Controlling magnetic vortices through exchange bias," http://dx.doi.org/10.1063/1.2165290, Jan. 23, 2006, 4 pages.

M. Tanase et al., "Magnetization reversal in circularly exchange-biased ferromagnetic disks," http://journals.aps.org/prb/abstract/10.1103/PhysRevB.79.014436, Jan. 27, 2009, 9 pages.

G. Salazar-Alvarez et al., "Direct evidence of imprinted vortex states in the antiferromagnet of exchange biased microdisks," http://scitation.aip.org/content/aip/journal/apl/95/1/10.1063/1.3168515, Jul. 10, 2009, 3 pages.

D. Meyners et al., "Influence of boundary roughness on the magnetization reversal in submicron sized magnetic tunnel junctions," http://dx.doi.org/10.1063/1.1544424, Mar. 1, 2003, 6 pages.

J. Nogués et al., "Exchange bias," http://www.sciencedirect.com/science/article/pii/S0304885398002662, Feb. 15, 1999, 30 pages.

J. Sort et al., "Magnetization Reversal in Submicron Disks: Exchange Biased Vortices," http://journals.aps.org/prl/abstract/10.1103/PhysRevLett.95.067201, Aug. 1, 2005, 4 pages.

Frederick Casper et al., "Vortex state free layer tunnelmagnetoresistance-sensors," http://www.dpg-verhandlungen.de/year/2014/conference/dresden/part/ma/session/55/contribution/57, Apr. 4, 2014, 1 page.

T. Wurft et al., "Influence of magnetic bias fields on the nucleation of magnetic vortices," 3 pages.

H. Brückl, "Feasibility Study: GMR Vortex Sensor," Sensor Solutions and Integration, Report No. 1.0, Feb. 19, 2013, 25 pages.

D. Gilbert, "A new reversal mode in exchange coupled antiferromagnetic/ferromagnetic disks: distorted viscous vortex," The journal is the Royal Society of Chemistry, 2015, pp. 9878-9885.

MAGNETIC SENSOR DEVICE HAVING A MAGNETO-RESISTIVE STRUCTURE THAT GENERATES A VORTEX MAGNETIZATION PATTERN

RELATED APPLICATION

This application claims priority under 35 U.S.C. § 119 to German Patent Application No. 102015121753.8, filed on Dec. 14, 2015, the content of which is incorporated by reference herein in its entirety.

FIELD

Examples relate to a magnetic sensor device and a method for a magnetic sensor device having a magneto-resistive structure.

BACKGROUND

Magneto-resistive effects include a number of different physical phenomena, all of which having in common that an electrical resistance of a resistive element is alterable by the behavior of a magnetic field penetrating the resistive element. Technologies utilizing magneto-resistive effects are sometimes referred to as "xMR technologies", whereby the "x" indicates that a multitude of effects may be addressed here, like the Giant Magneto-Resistive (GMR) effect, the Tunnel Magneto-Resistive (TMR) effect, or the Anisotropic Magneto-Resistive (AMR) effect, to mention just a few examples. xMR effects may be applied in a variety of field-based sensors, for example for measuring revolution, angles, etc. In some applications, especially in applications relevant to safety, it is required that these sensors operate reliably and at a high level of accuracy.

A sensor may, in some applications, be subject to perturbations in the form of unknown or incalculable magnetic fields. These perturbations may randomly change a state or an initial value of the sensor. Since hysteresis behavior of the sensor may result in a substantial difference whether a measured value is approached from an initial value above or below the measured value, hysteresis may lead to an error in measurement results. A magnetic xMR sensor concept with a free layer in a vortex configuration may have nearly zero hysteresis. Low hysteresis may in other words be achieved in the presence of a vortex shaped magnetization state (magnetic field) in the free layer, and may especially be interesting in applications such as wheel speed sensing, current sensing, or linear field sensing. The vortex shaped magnetization state, however, may only be stable in a certain range regarding field strength of the applied field to be measured.

It is hence desirable to provide a sensor element enabling improved accuracy and reliability of measurement results.

SUMMARY

An example relates to a magnetic sensor device comprising a magneto-resistive structure. The magneto-resistive structure comprises a magnetic free layer configured to spontaneously generate a closed flux magnetization pattern in the magnetic free layer. The magneto-resistive structure also comprises a magnetic reference layer having a non-closed flux reference magnetization pattern. The magnetic sensor device further comprises a magnetic biasing structure configured to generate a biasing field in the magnetic free layer. The biasing field has a non-zero magnetic biasing field component perpendicular to the reference magnetization pattern. A magneto-resistive structure may for example be formed by alternating magnetic and non-magnetic layers. The terms "magnetic" and "non-magnetic" may in this context be understood as "ferromagnetic" and "non-ferromagnetic". A "non-magnetic" layer may thus have paramagnetic, diamagnetic or antiferromagnetic properties. A layer may extend essentially into two directions x and y of a Cartesian coordinate system with three pair-wise perpendicular directions x, y, and z. In other words, an extension of the layer into a third direction z may be negligibly small compared to its extension into the first and second directions x and y. If direction x corresponds to a direction of the reference magnetization, the biasing field may for instance have an x-component equal to zero, and non-zero y- and z-components. The closed flux magnetization pattern may also be referred to as a vortex state. A spontaneously generated vortex state may for instance form in the free layer directly after its production, or if no external field is applied. The non-closed flux reference magnetization pattern may in other words correspond to a homogeneous, straight, or linear magnetic field having zero curl and zero divergence. This implementation may widen up a range of values of an external magnetic field to be measured, in which the vortex state is spontaneously generated. In consequence, a field range in which hysteresis vanishes may be extended, which in turn may increase reliability. Upper and lower limits of this field range may be referred to as nucleation field threshold.

In some embodiments, the magnetic biasing structure is configured to generate the biasing field having a non-zero biasing field component in-plane. The term in-plane may refer to the free layer extending predominantly in the x-y-plane. Thus, an in-plane component perpendicular to the reference magnetization pattern may in other words correspond to a y-component.

In some embodiments, the magnetic biasing structure is configured to generate the biasing field as a directionally fixed magnetic field. This may lift the vortex nucleation field threshold of the external magnetic field to a predetermined or fixed value.

In some embodiments, the magnetic biasing structure is configured to generate the biasing field in the magnetic free layer perpendicular to the reference magnetization pattern. In other words, also a z-component of the biasing field may be zero. The effect of an extended vortex formation range may hence be increased or even maximized.

In some embodiments, the magnetic free layer is of centrally symmetric shape. This shape may in other words result from rotation by a predetermined angle around a central axis parallel to the z-direction, and for example comprise equiangular, equilateral, or regular polygons (triangle, square, hexagon, etc.), or ellipses. Spontaneous vortex formation may thus be facilitated. The shape of the free layer may, among other factors, determine an original width of the vortex formation range for the external field if no biasing field is applied.

In some embodiments, the magnetic free layer is of rotationally symmetric shape. In other words, the free layer may exhibit a disk shape. Spontaneous vortex formation may be facilitated even further if a disk shape is used.

In some embodiments, a ratio between a thickness and a diameter of the magnetic free layer is in a range from 1/500 to 1/5. Thickness may be measured along z-direction, and diameter in x-y plane. If the free layer has a non-circular shape, diameter may correspond to e.g. a major or a minor axis of an ellipse, or to a diameter of an inscribed or a circumscribed circle of a polygon. The ratio between thickness and diameter of the free layer may provide another factor that may determine an original width of the vortex formation range for the external field. By choosing a value within the abovementioned range vortex formation may be significantly alleviated.

In some embodiments, the magnetic biasing structure is configured to generate the biasing field with a biasing field strength causing a nucleation field threshold, at which the closed flux magnetization pattern is spontaneously generated, to be larger in presence of the biasing field than in absence of the biasing field. In other words, triggering a notable effect (e.g. at least 1, 2, or 5%) may require setting the biasing field strength to a value within a predetermined interval. This way, the effect of lifting the nucleation field threshold may be more pronounced.

In some embodiments, the magnetic biasing structure is configured to generate the biasing field with the biasing field strength causing the nucleation field threshold to be larger in presence of the biasing field than in absence of the biasing field by at least 5 Oe or even 10 Oe. If multiplied with the magnetic field constant $\mu_0$, 5 Oe may correspond to 0.5 mT.

In some embodiments, the magnetic biasing structure is configured to generate the biasing field with a biasing field strength being at most 1/5 of an annihilation threshold for the external magnetic field, at which the closed flux magnetization pattern is annihilated. The annihilation threshold may describe a value for the external field at which, if exceeded, the vortex structure of the magnetic field in the free layer may dissolve. Going below this value thereafter may give rise to hysteresis behavior of the free layer until the vortex structure is re-formed at the nucleation field threshold.

In some embodiments, the magnetic biasing structure comprises an antiferromagnetic layer to generate an exchange bias field in the free layer. An increased amount of compactness may thus be achieved for the magnetic sensor device, which may be desirable in applications where implementation volume may be scarce, e.g. automobiles.

In some embodiments, the free layer is arranged between the antiferromagnetic layer and the reference layer. Providing the biasing field may hence be less problematic. Further, a higher level of compactness of the magnetic sensor device may result.

In some embodiments, the antiferromagnetic layer is arranged directly adjacent to the free layer. Another layer between the free layer and the antiferromagnetic layer may hence be omitted. This may provide a more simplified approach to provide the biasing field.

In some embodiments, the free layer has a thickness exceeding a thickness of the reference layer by at least a factor of 3. This may help to keep the exchange bias effect in the free layer low compared to the reference layer. Therefore, the strength of the biasing field may come to lie within a range where the boost provided to the vortex formation range is more pronounced. The effect of the biasing field may thus even be optimized.

In some embodiments, the magnetic biasing structure comprises one or more permanent magnets or electromagnets configured to generate the biasing field in the free layer. This may enable possibilities to apply the biasing field to already existing magneto-resistive structures. In other words, the one or more permanent magnets or electromagnets may be arranged separately from a substrate on which the magneto-resistive structure is integrated.

In some embodiments, the magnetic biasing structure comprises at least a first and a second permanent magnet located on opposite sides of the free layer. This may result in a more linear shape of the biasing field. Furthermore, thickness of the permanent magnets in z-direction may be reduced, thus probably leading to a less volume-intensive implementation.

In some embodiments, the magnetic biasing structure comprises an electrical conductor, configured to generate, responsive to an electric current in the electrical conductor, a magnetic field in the free layer corresponding to the biasing field. This may allow an integration of the magnetic biasing structure and the magneto-resistive structure on a common substrate or chip. Correct adjustment of the biasing field may further be simplified this way.

In some embodiments, the magneto-resistive structure corresponds to a giant magneto-resistive, GMR, structure or a tunnel magneto-resistive, TMR, structure. Various implementations may hence be applicable to different sensor types.

According to another aspect, some embodiments relate to a magneto-resistive sensor element. The magneto-resistive sensor element comprises a magnetic free layer configured to spontaneously generate a vortex magnetization pattern in the free layer. The magneto-resistive sensor element also comprises a magnetic reference layer having a linear reference magnetization pattern. The magneto-resistive sensor element further comprises a magnetic biasing structure configured to generate a directionally fixed biasing field perpendicular to the reference magnetization pattern in the magnetic free layer.

In some embodiments, the magnetic biasing structure is configured to generate the biasing field with a biasing field strength in a range from 1 Oe to 60 Oe.

According to a further aspect, some embodiments relate to a method for a magnetic sensor device having a magneto-resistive structure. The method comprises providing a non-closed flux reference magnetization pattern in a magnetic reference layer of the magneto-resistive structure. The method also comprises generating a biasing field in a magnetic free layer of the magneto-resistive structure. The biasing field has a non-zero magnetic biasing field component perpendicular to the reference magnetization pattern. The method further comprises spontaneously generating a closed flux magnetization pattern in the magnetic free layer. A range of values of an external magnetic field to be measured, in which the vortex state is spontaneously generated, may thus be extended. In this range hysteresis may vanish, which in turn may increase reliability of the magnetic sensor device.

BRIEF DESCRIPTION OF DRAWINGS

Some embodiments of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent", to name just a few examples).

The terminology used herein is for the purpose of describing particular examples is not intended to be limiting for further examples. Whenever a singular form such as "a," "an" and "the" is used and using only a single element is neither explicitly or implicitly defined as being mandatory, further examples may also plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong, unless expressly defined otherwise herein.

Figure 1:
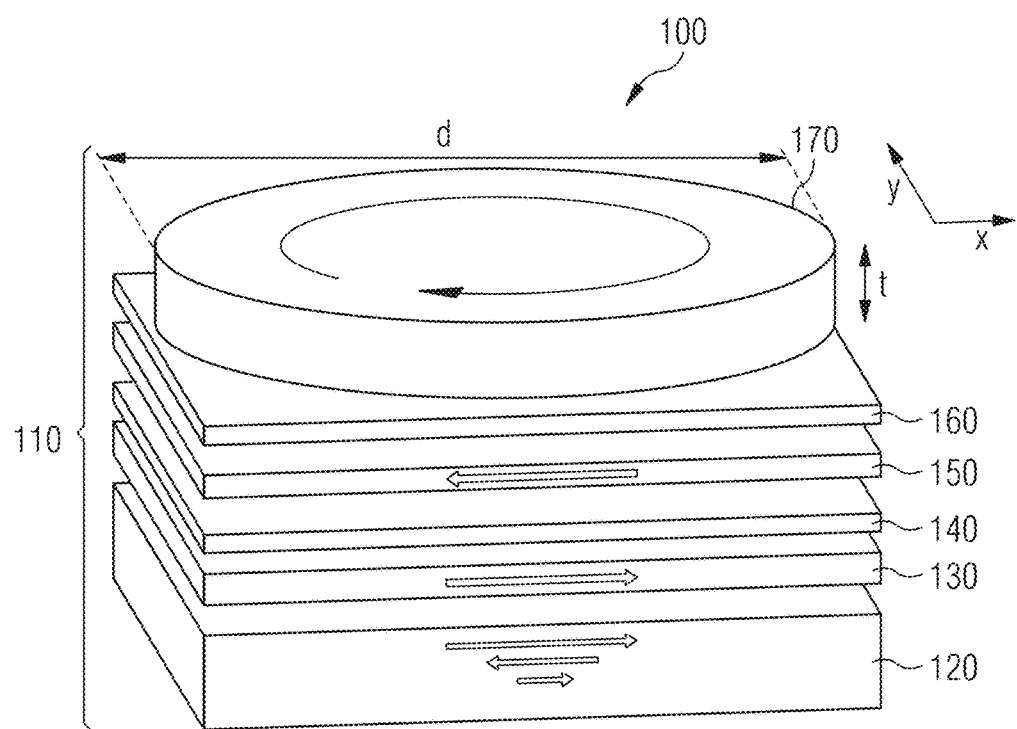
FIG. 1 shows an exploded view example of a TMR Bottom Spin Valve, BSV, structure with a free layer in magnetic vortex state.

FIG. 1 shows an example of a tunnel-magneto-resistive, TMR, sensor element 100, which is also known as a spin valve or bottom spin valve, BSV. TMR sensor element 100 has a layer stack 110 of alternating ferromagnetic and non-ferromagnetic layers. If described in a Cartesian coordinate system with pair-wise perpendicular coordinate axes x, y, and z, the layers each extend in a plane spanned by the x and y axes. The extent of a layer in z-direction may be described as the layer thickness t.

From the bottom up, TMR sensor element 100 comprises an antiferromagnetic pinning layer 120 and a ferromagnetic pinned layer 130. Contact between pinning layer 120 and pinned layer 130 provokes an effect known as exchange bias effect, causing the magnetization of pinned layer 130 to align in a preferred direction. In other words, pinned layer 130 exhibits a linear magnetic flux pattern which, in FIG. 1, is parallel to the x-direction. TMR sensor element 100 further comprises a coupling layer 140. Coupling layer 140 may be diamagnetic and for example comprise ruthenium, iridium, copper or copper alloys and similar materials. Coupling layer 140 spatially separates pinned layer 130 from a ferromagnetic reference layer 150. Using this setup, magnetization of reference layer 150 may align and be held in a direction anti-parallel to the magnetization of pinned layer 130. TMR sensor element 100 also comprises a tunnel barrier 160 which is electrically insulating and separates reference layer 150 from a ferromagnetic free layer 170. Free layer 170, reference layer 150 and pinned layer 130 may in some embodiments comprise iron, cobalt or nickel, and in some further embodiments alloys of these. Alloys may also comprise non-ferromagnetic materials, e.g. carbon, with ferromagnetic materials constituting at least 50% of a material composition of the respective layer. For example, layers may comprise cobalt-iron, CoFe, or nickel-iron, NiFe, alloys. In contrast, pinning layer 120 may comprise for example iridium, manganese, platinum, or alloys comprising these.

While in operation, or when coupled to an electric circuit, electrical charges may pass from one side of tunnel barrier 160 to another in a predetermined amount if a constant external magnetic field is applied. The TMR effect is a quantum physical phenomenon expressing itself in a change of the amount of charges passing the tunnel barrier when the direction of the external magnetic field is changed. This effect may arise due to directional changes of the magnetization of free layer 170 caused by the changing external magnetic field.

Free layer 170 in FIG. 1 is of circular shape, or, in other words, has a disk-like structure. The disk has a diameter d which may, for example be in a range of several hundred nm to 10 μm. The disk further has a thickness t in the range of e.g. one nm to 100 or 200 nm. Providing a layer having this structure may lead to spontaneous formation of a closed flux magnetization pattern in free layer 170. In other words, rotation $\nabla \times \vec{H}$ of a magnetic field $\vec{H}$ in free layer 170 may differ from zero, or magnetic field lines may form closed loops inside the disk. Occurrence of such a field may also be called a vortex state or vortex configuration. The vortex state may in other words be obtained by choosing the disk thickness t in the range of e.g. 10 nm up to 100 nm and the disk diameter d between 500 nm and 3 µm. The vortex spin valve structure may not be limited to TMR effect; it also may be realized for example via Giant Magneto-Resistance (GMR).

A magnetic xMR sensor concept with a free layer in vortex configuration may have nearly zero hysteresis which may be especially interesting in applications such as wheel speed sensing or current sensing. Prerequisite for low hysteresis may be the presence of the vortex state. Critical parameters which may describe the regime in which the vortex state exists are nucleation field $H_n$, where the vortex nucleates, and annihilation field $H_{an}$, where it gets destroyed again.

Figure 2:
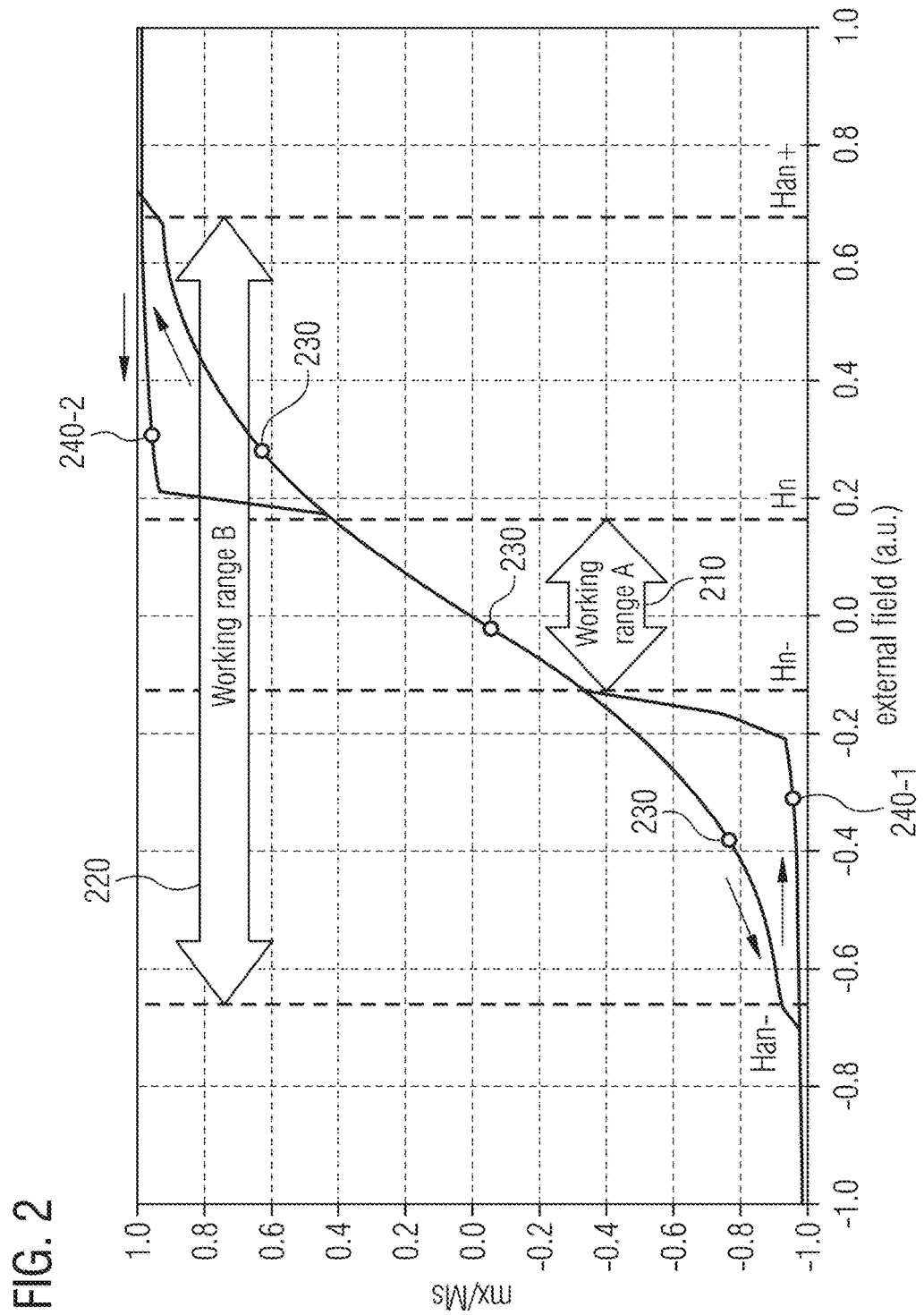
FIG. 2 shows a schematic hysteresis loop of a single, disk-shaped free layer element showing vortex-characterizing nucleation field and annihilation field.

FIG. 2 depicts schematic hysteresis loops of a single, disk-shaped free layer element showing the vortex characteristics nucleation field $H_n$ and annihilation field $H_{an}$. Plotted is the normalized in-plane component (or the x-component) of the magnetization $m_x/M_s$ against the external field, which is equivalent to the sensor signal of an according spin valve structure. Therein, two different working ranges may be distinguished. Working range A, or vortex formation range 210, is defined by the nucleation fields $H_{n+}$ and $H_{n-}$, and may be unaffected by the magnetic history since vortex nucleation may always be ensured. Working range B, or vortex annihilation range 220, is defined by the annihilation fields $H_{an+}$ and $H_{an-}$, and as long as it is not exceeded (for example by a disturbance in form of a magnetic field pulse) the vortex state may be preserved. In other words, the in-plane component of the magnetization $m_x/M_s$ may be shifted along curve 230 by altering the external magnetic field. However, after an event out of vortex annihilation range 220 a "reset" may be needed in order to re-form the vortex structure by reducing the external field strength to a value within vortex formation range 210. In between said event and vortex re-formation, the in-plane component of the magnetization $m_x/M_s$ may follow a hysteresis curve 240-1; 240-2.

A robust sensor may ideally always be operating in the vortex state, or at least most of the time of operation. Hence, it may be desirable to extend vortex formation range 210, or even to render it as large as possible. Embodiments provide a means to increase the value of $H_n$ thus increasing substantially the operating range of a vortex state based sensor.

Some exemplary means to tune the nucleation fields of a vortex state sensor may relate to different material systems, the thickness to diameter ratio t/d and a zero field cooling procedure with an additional antiferromagnet on top of the free layer.

In theory (e.g. micromagnetic simulations) differences in nucleation field for different materials may occur. Corresponding material parameters that may change are saturation magnetization, exchange stiffness and crystalline anisotropy. Since the vortex state evolves out of minimizing energy, the nucleation field $H_n$ may be mainly affected by the stray field energy and by the exchange energy. Thus an increase in exchange stiffness may decrease $H_n$ while an increase in saturation magnetization may increase $H_n$. When comparing literature values with simulation results, the difference in nucleation field $H_n$ e.g. of a 1 µm disk, 20 nm thick may for example be about 75 Oe for CoFe, and −30 Oe for NiFe.

A thickness-to-diameter ratio t/d of the free layer disk may have an influence on the width of vortex formation range 210. An increased thickness t may increase $H_n$ as well as a reduced diameter d. This relation could also be confirmed by measurements, but due to the fact of limitations in the integration size the effect may not be fully exploited by using conventional means. Further investigations with even thicker free layers (e.g. >50 nm) may present an option, however, problems could arise from structuring of such thick xMR-stacks. For GMR, the increase in free layer thickness may also reduce the magneto-resistive effect.

A further conventional option may use a so-called "zero field cooling" (ZFC) procedure with an additional antiferromagnet on top of the free layer. It may thus be possible to imprint a vortex magnetization pattern at the surface of the antiferromagnet, which may shift and/or improve the nucleation field. However, the complexity of the xMR-stack and its processing may be significantly increased by this measure.

Figure 3:
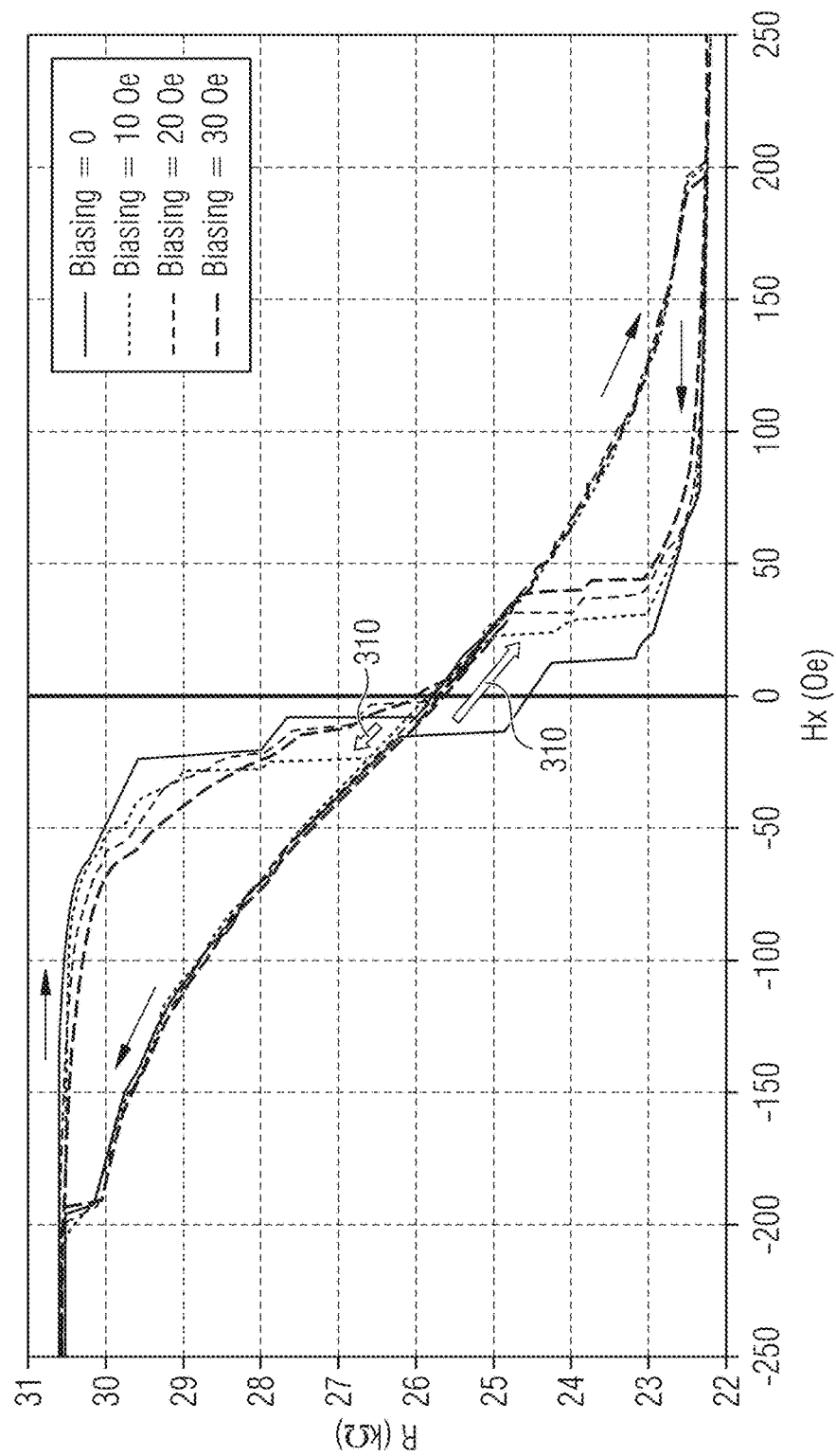
FIG. 3 shows hysteresis loops of two TMR cells, each with a disk shaped NiFe free layer according to an embodiment.

Embodiments relate to a combination of a magnetic vortex sensor with a magnetic bias field perpendicular to the sensing direction in order to improve the nucleation performance of the magnetic vortex state. The facilitating effect of a magnetic bias field on the vortex nucleation may be demonstrated under lab conditions within a certain range of bias fields. In experimental data a shift of the nucleation field due to presence of biasing field may be observed, as shown in FIG. 3. Electrical resistance R in kΩ is plotted against the x-component of the external field in Oe. Therein, hysteresis loops of two TMR cells, each with a t=20 nm thick and d=2 µm diameter disk shaped NiFe free layer are shown. Different bias fields with respective strengths of 0, 10, 20, and 30 Oe were applied perpendicular to the sensing direction. Arrows 310 indicate the shift of the nucleation field $H_n$ for a 10 Oe bias field.

Depending on the bias field strength different pronounced shifts of $H_n$ may be observed. Regarding the resulting symmetry of the nucleation fields for positive and negative branch of the loop in FIG. 3, an optimum in biasing may be around 10 Oe in this case. Other structures may not show such an asymmetric nucleation path without biasing and in this case a more or less symmetric shift of $H_n$ due to biasing may be observed. For small bias fields such as 10 Oe a facilitating influence on the nucleation field for the sensor application may be observed.

In the following, it is explained why a shift in nucleation field may occur if a bias field is present.

Figure 4:
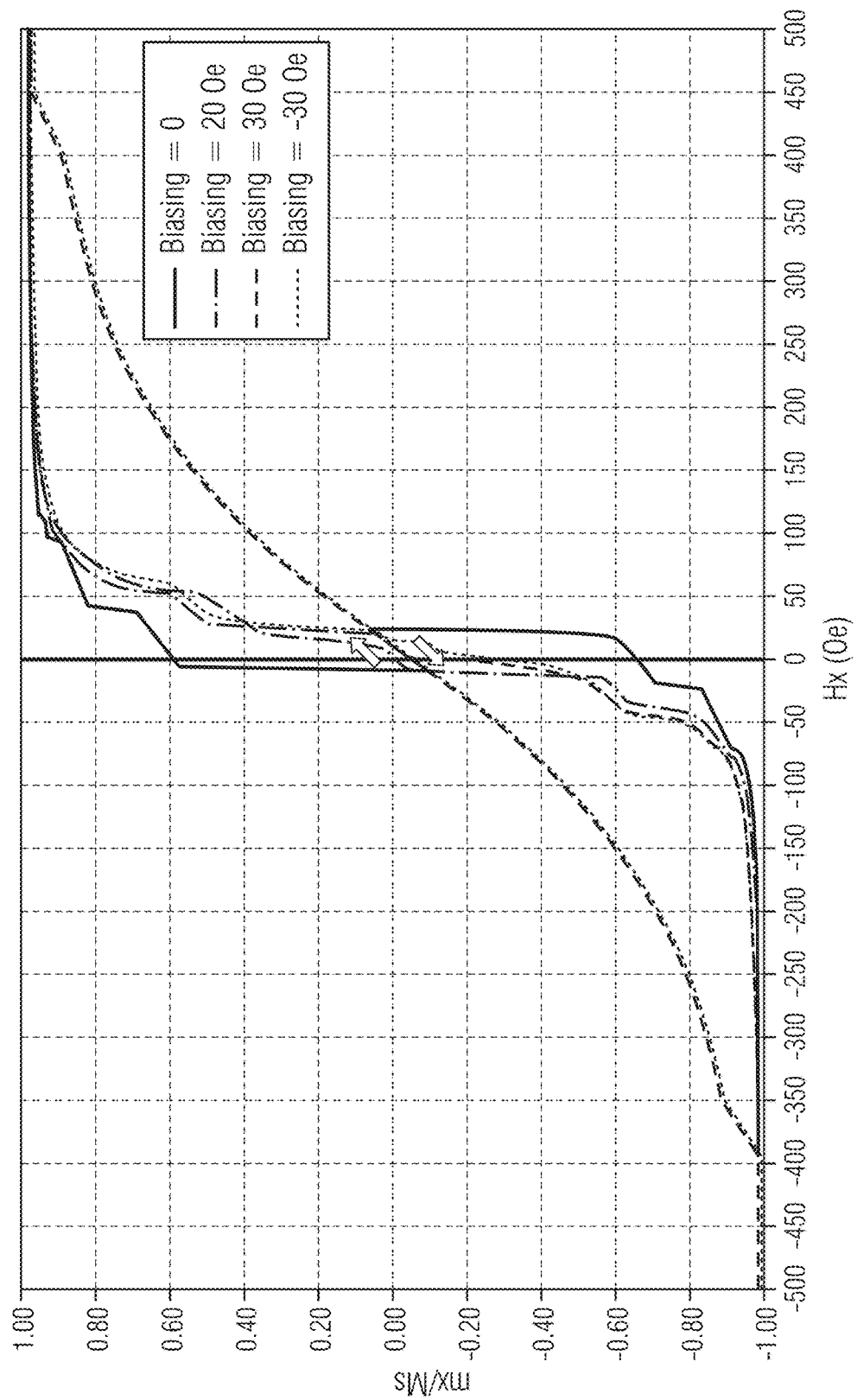
FIG. 4 shows simulation results for different bias fields perpendicular to a sensing direction of a spin valve structure according to an embodiment.

Micromagnetic simulation results of a comparable spin valve structure are shown in FIG. 4. The plotted results in FIG. 4 show the free layer response of a 20 nm thick 1 µm diameter disk. The same effects as in the experimental data may be observed. A shift of the nucleation field if a bias field perpendicular to the sensing direction ($H_x$) is applied and the strength of the shift depends on the biasing field strength. The reason for the different nucleation fields may be connected with different pre-vortex magnetization states. It may be seen in FIGS. 2 and 3 that the x-component of the free layer disk magnetization may decline significantly faster with decreasing $|H_x|$ if a bias field is applied. This may lower the energy barrier of a vortex nucleation under certain circumstances.

Figure 5:
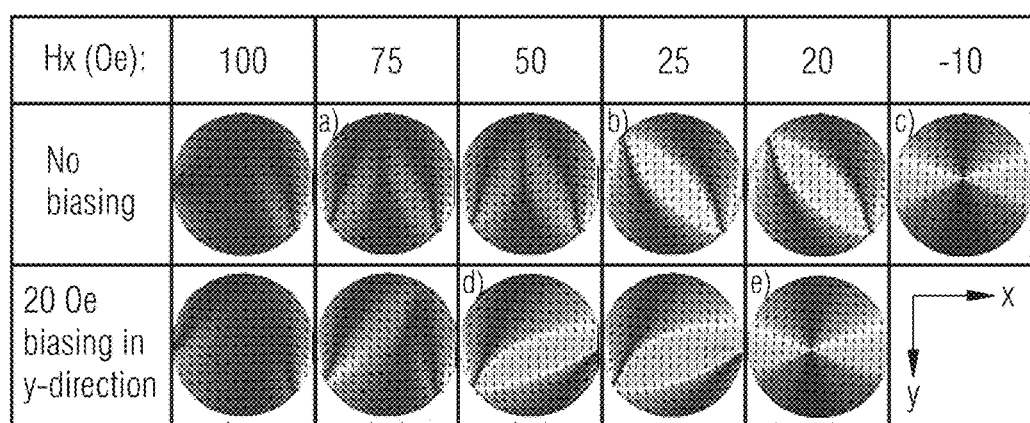
FIG. 5 shows a comparison of simulation results of the magnetization patterns without bias field and with a 20 Oe bias field.

Turning now to FIG. 5, the magnetization patterns are shown for different external field strengths in sensing direction (corresponding to the x-component of the field) without a biasing field and with a 20 Oe biasing field in y-direction, respectively. It may be observed, firstly, that without biasing there is a well pronounced C-state between 90 Oe and 40 Oe (see panel a), in which magnetic field lines follow the shape of the letter C. This state may be skipped with biasing in some cases. Furthermore, the C-state may have a more pronounced asymmetry with biasing. An asymmetric shape is formed which passes smoothly into an S-state, in which magnetic field lines follow the shape of the letter S. Secondly, the S-state without biasing (see panel b) is more stable and even at −5 Oe there is no pronounced asymmetry (not shown here). At −10 Oe the vortex state is reached (see panel c) In contrast, with biasing the C-state is skipped and at 50 Oe already an asymmetric S-state is present (see panel d). Because of the pronounced asymmetry which is present when leaving saturation, the sense of rotation of the subsequent vortex state is apparent even before nucleation. Vortex nucleation is finished at 20 Oe (see panel e). A person skilled in the art will appreciate from FIG. 5 that in presence of a biasing field the S-shape—which precedes the vortex state—is formed much earlier and has already an asymmetric distribution of the magnetization directions.

Figure 6A:
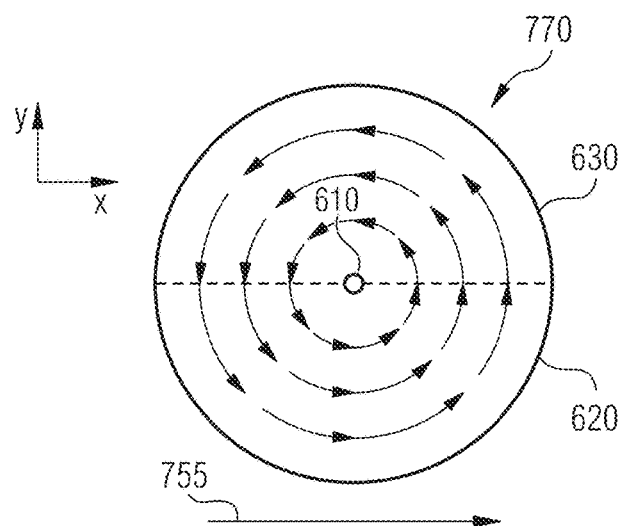
FIGS. 6A-6C show changes in a closed flux magnetization pattern in a free layer according to an embodiment, in presence of various external fields.
Figure 6B:
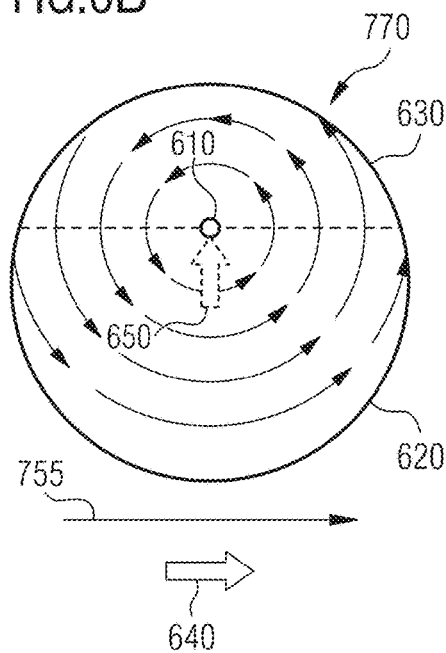
Figure 6C:
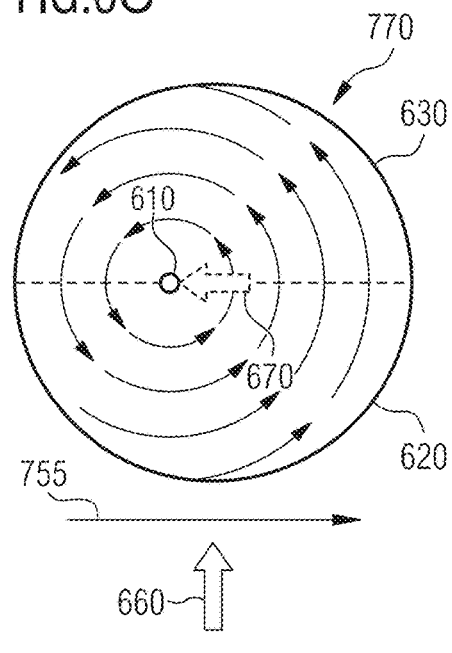

FIGS. 6A-6C illustrate a mode of operation for an xMR sensor having a free layer 770 with a vortex-shaped magnetic flow pattern (compare also FIG. 5, panels c and e). As shown in FIG. 6A, a vortex center 610 is located at the center of disk-shaped free layer 770, if an external field is equal to zero. The shape of free layer 770 may in other embodiments differ from a disk shape. A reference magnetization 755 of a reference layer is directed parallel to the x-direction. The following explanation is supposed to clarify why the direction of the reference magnetization 755 may act as a preferred sensing direction for an xMR sensor in presence of a vortex state in free layer 770.

If a magnetic field with closed-flux pattern or vortex is centered on disk-shaped free layer 770, a first portion 620 of the disk with field lines having a component parallel to reference magnetization 755 may be equally large as a second portion 630 of the disk with field lines having a component antiparallel to reference magnetization 755. In other words, a net direction of the free layer magnetization integrated over the entire disk surface may equal zero. It is to be noted, however, that the first and second disk portions 620; 630 may not be sharply separated, but may rather pass over smoothly into one another, which is indicated by the dashed lines in FIGS. 6A-6C.

Application or change of the external field 640 in x-direction may lead to a shift 650 of the vortex center 610 in y-direction, or perpendicular to x, which is illustrated in FIG. 6B. If the external field is increased to a value having the same sign as reference magnetization 755 (or if external field and reference magnetization 755 are parallel), the net direction of the free layer magnetization integrated over the entire disk surface may for example become positive. In FIG. 6B, the effect corresponds to a growth in size of first portion 620, and a decrease in size of portion 630. Accordingly, if the external field is lowered to a value having the opposite sign of reference magnetization 755, the net direction of the free layer magnetization may for example become negative.

Some magneto-resistive effects, e.g. TMR, exploit the fact that electrical resistance depends on parallel or antiparallel alignment of the magnetizations in free layer 770 and in the reference layer. In presence of vortex-structured magnetization of free layer 770, electrical resistance may thus depend on a direction of the net magnetization of the entire free layer 770 (or the size proportion of first portion 620 and second portion 630) relative to a direction of reference magnetization 755. A transition from a state corresponding to FIG. 6A to a state corresponding to FIG. 6B may hence result in notable changes in electrical resistance of an xMR sensor device comprising free layer 770.

FIG. 6C depicts a result that may occur if a change 660 of the external field in y-direction, or perpendicular to reference magnetization 755, takes place. Therein, a vortex shift 670 in x-direction may result. As may be seen from FIG. 6C, change 660 of the external field in y-direction may leave the relative sizes of the first and second portions 620; 630 (or the cumulative value of parallel field line components in relation to the cumulative value of antiparallel components) unchanged. Hence, the net magnetization of free layer 770 may remain unchanged, which in turn may not provoke any notable change in electrical resistance of the xMR sensor device. The direction of reference magnetization 755 may therefore, independently of its sign, be regarded as a preferred sensing direction.

Figure 7:
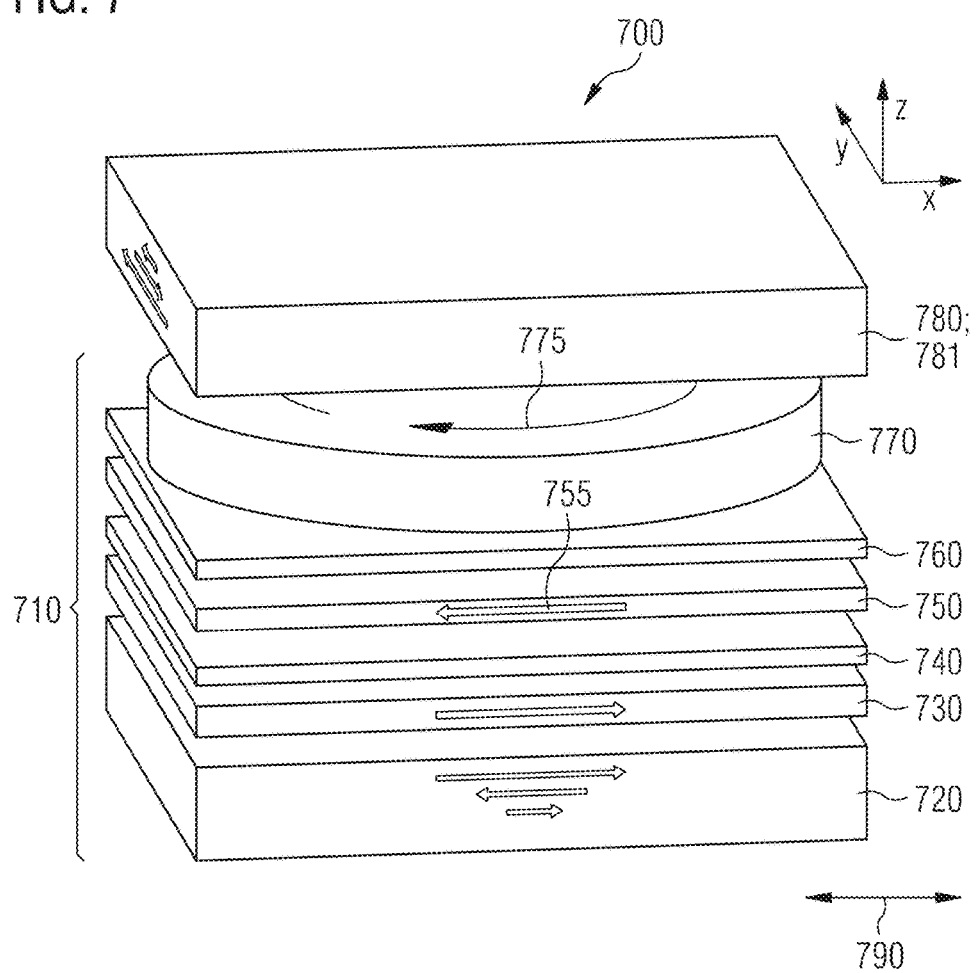
FIG. 7 shows an exploded view of a TMR vortex structure with a homogenously exchange biased free layer according to an embodiment.

An embodiment of such a magnetic sensor device 700 comprising a magneto-resistive structure 710 is depicted in FIG. 7. Magneto-resistive structure 710 may correspond to magneto-resistive structure 110 from FIG. 1. Components having a corresponding counterpart in FIG. 1 are not explained again in the following example; however, potential differences will be referred to. Magneto-resistive structure 710 comprises a magnetic reference layer 750 having a non-closed flux reference magnetization pattern, which may also be regarded as a homogeneous, straight, or linear field. The preferred sensing direction 790 therein is determined by reference magnetization 755, and hence parallel to the x-direction. Magneto-resistive structure 710 also comprises magnetic free layer 770 configured to spontaneously generate a closed flux magnetization pattern or vortex 775 in free layer 770. Magnetic sensor device 700 further comprises a magnetic biasing structure 780 configured to generate a biasing field in magnetic free layer 770. The biasing field has a non-zero magnetic biasing field component perpendicular to reference magnetization 755. In other words, the biasing field may have a zero x-component, and non-zero y- and/or z-components. Reference magnetization 755 may have a non-zero x-component, and zero y- and z-components. In a further embodiment, the biasing field has a non-zero in-plane component perpendicular to reference magnetization 755. In other words, the y-component of the biasing field may be non-zero, and the z-component may be zero or, alternatively, non-zero.

Magnetic biasing structure 780 may for example be implemented as a layer comprised in magneto-resistive structure 710, of which one embodiment is shown in FIG. 7. Alternatively, magnetic biasing structure 780 may for example be implemented externally with respect to the layer stack (magneto-resistive structure 710), which will be explained more closely in some of the following embodiments.

In some embodiments, the biasing field is a directionally fixed magnetic field. In some further embodiments, the biasing field may follow a direction in magnetic free layer 770 and perpendicular to reference magnetization pattern 755. In other words, also a z-component of the biasing field may be zero, or the biasing field may be coplanar to free layer 770.

Magneto-resistive structure 710 may resemble a layer stack of alternating magnetic and non-magnetic layers, corresponding to the example in FIG. 1. The layer stack may, from the bottom up, comprise an antiferromagnetic pinning layer 720, a magnetic pinned layer 730, a non-magnetic coupling layer 740, reference layer 750, an electrically insulating tunnel barrier 760, and free layer 770. Magneto-resistive structure 710 may be configured to use the TMR effect for measurement of an external magnetic field, or may alternatively be configured to use another xMR effect, e.g. GMR. In some embodiments, reference layer 750 may also correspond to or be identical with pinned layer 730.

In FIG. 7, magneto-resistive structure 710 is implemented as an antiparallel (AP) pinned structure, with pinned layer 730 and reference layer 750 being separated by coupling layer 740 and their magnetic moments being antiparallel. Spin valve sensors comprising magneto-resistive structure 710 may further be implemented as a simple pinned structure comprising one (e.g. pinned layer 730) or more ferromagnetic layers (e.g. pinned layer 730 and reference layer 750) with a unidirectional magnetic moment. In an AP pinned layer structure, the magnetizations of pinned layer 730 and reference layer 750 may substantially counterbalance one another. Thus the net magnetization of the AP pinned layer structure may less affect the quiescent parallel position of free layer 770. Some embodiments may refer to a magneto-resistive structure 710 having only one ferromagnetic layer apart from free layer 770, or, in other words, omitting reference layer 750. Magnetization therein may however be more unstable against external fields.

Spin valve sensors comprising magneto-resistive structure 710 may still further be classified as single or dual. A single spin valve sensor may employ only one pinned layer and a dual spin valve sensor may employ two pinned layers, for example with the free layer structure located in between. Magneto-resistive structure 710 may, in some further embodiments, represent a hard magnetic, or also a multi-layer reference system with three or more ferromagnetic layers separated by spacer layers, coupled parallel or antiparallel.

Though free layer 770 in FIG. 7 is depicted in a disk shape, other centrally symmetric or rotationally symmetric shapes may be realized in different embodiments. Such shapes may for example comprise ellipses, triangles, quadrangles (squares, rhombuses, etc.), regular or axisymmetric hexagons, or other polygons just to mention a few possibilities. Moreover, any other shape which does not have such symmetry, for example an irregular polygon or a disk which is cut at one side, may even be used. The free layer thickness may for example have a value between 10 nm and 100 nm, and its diameter may have a value between 500 nm and 5 µm. The thickness-to-diameter ratio t/d of free layer 770 may thus be preferably in a range from 1/500 to 1/5.

Embodiments may relate to a multitude of different technical implementations which may be separated into on-chip and external solutions. In FIG. 7, an embodiment for an on-chip solution is presented, in which magnetic biasing structure 780 comprises an antiferromagnetic layer 781 to generate an exchange bias field in free layer 770. This embodiment may, in other words, involve a substantially homogeneous biasing acting on free layer 770 as an exchange biasing of free layer 770. Said exchange biasing may be achieved by adding an additional antiferromagnetic layer 781 on top of free layer 770 (for example in case of a BSV structure as shown in FIG. 7) and optionally performing an additional field cooling procedure.

It is to be noted that the gap between free layer 770 and antiferromagnetic layer 781 is merely due to the exploded view of FIG. 7. In some embodiments, biasing will be observed if there is some form of coupling. Such coupling may for example be an interlayer exchange coupling where free layer 770, a ruthenium layer, a further ferromagnetic layer and antiferromagnetic layer 781, in this order, are in contact. Coupling may further occur as magneto-static coupling, where free layer 770, a non-magnetic spacer, a further ferromagnetic layer and antiferromagnetic layer 781, in this order, are in contact. In yet another example, coupling between free layer 770 and antiferromagnetic layer 781 may be achieved by a direct contact, leading to direct exchange biasing.

Antiferromagnetic layer 781 is drawn with a rectangular shape for reasons of clarification of the unidirectional exchange biasing in y-direction. The resulting structure of free layer 770 and top antiferromagnet 781 may be similar to pinned layer 730 together with bottom antiferromagnet 720. Free layer 770 may however be thicker than pinned layer 730, for example by a factor of 3 or 5, or even more. In embodiments where pinned layer 730 corresponds to reference layer 750, free layer 770 may accordingly exceed the thickness of reference layer 750 by a factor of 3 or 5, or more. For example, a 10 nm thick free layer (770) and a 2 nm thick reference layer (750) or pinned layer (730) may be employed. Since the exchange bias effect is a surface effect, an exchange bias field $H_{eb}$ of free layer 770 (which may be described as the shift of the hysteresis curve of a single ferromagnetic layer due to the ferromagnetic-antiferromagnetic exchange coupling) may thus be much smaller compared to $H_{eb}$ of pinned layer 730, even for identical antiferromagnetic materials and field cooling procedures. This may result in exchange bias fields between 10 Oe and 100 Oe. In this range for example the exchange bias field of a 30 nm thick NiFe film in combination with IrMn may be located and may be tuned by changing the IrMn-thickness. In other embodiments, reference layer (750) may have a larger extent and/or thickness compared to a structure of free layer (770). Moreover, even reference layer (750) may have a vortex-shaped magnetization pattern.

The exchange biasing of free layer 770 may preferably be realized perpendicular to the exchange biasing of the pinned layer and also in-plane, as indicated by arrows parallel to the y-direction in FIG. 7. For the realization of two different field-cooling procedures two different blocking temperatures may be used. This may in some embodiments be realized by using two different antiferromagnetic materials, such as for example PtMn and IrMn. The blocking temperature and exchange bias field may also be tuned by the thickness of antiferromagnetic layer 781. Embodiments related to a homogenously exchange biased free layer 770 may improve the vortex nucleation, when coming from saturation parallel to the x-direction.

In some embodiments, the exchange biasing of free layer 770 may be mediated by an additional layer arranged between antiferromagnetic layer 781 and free layer 770. The additional layer may for example be ferromagnetic, and experience the actual exchange biasing effect, causing a directional fixing of its magnetization. Free layer 770 may be influenced by the magnetization of the additional layer. Said magnetization may thus represent the biasing field.

In some alternative embodiments, antiferromagnetic layer 781 is arranged directly adjacent to free layer 770. Free layer 770 is arranged between antiferromagnetic layer 781 and reference layer 750. On the one hand, this may lead to a more pronounced exchange bias effect. On the other hand, the exchange bias effect is mitigated by an increasing thickness of free layer 770. This way, a value of the biasing field may be balanced according to individual demands, or even optimized. In turn, vortex stability may be better exploited.

For some approaches using unidirectional exchange biased free layer thickness of e.g. 12 nm and disk diameters of 400 and 800 nm no vortex nucleation may be observed for a perpendicular orientation of biasing direction and external field. According to some embodiments, for thicker free layers the nucleation field may be positively shifted. Furthermore, for smaller structures and a parallel orientation of bias field and external field a vortex nucleation may be observed. For perpendicular orientation a coherent rotation reversal may be observed with magnetic force microscopy. The proposed homogenously exchange biasing of free layer 770 may further be combined with zero field cooling in an embodiment by adding a tempering process step without external field.

A person skilled in the art having benefit from the disclosure will appreciate, that similar results may be achieved using further embodiments not explicitly shown in FIG. 7. In one of these embodiments, another ferromagnetic layer between free layer 770 and antiferromagnetic layer 781 may experience the exchange bias effect, and generate a magnetic field which influences the magnetization of free layer 770 accordingly. In another one of these embodiments, antiferromagnetic layer 781 is arranged below free layer 770. In a further one of these embodiments, the biasing field may have a non-zero component perpendicular to reference magnetization 755, and a non-zero component parallel to reference magnetization 755. In other words, an angle between biasing field and reference magnetization 755 may deviate from 90°, for example by a value up to 5°, 10°, 20° or even more.

Figure 8:
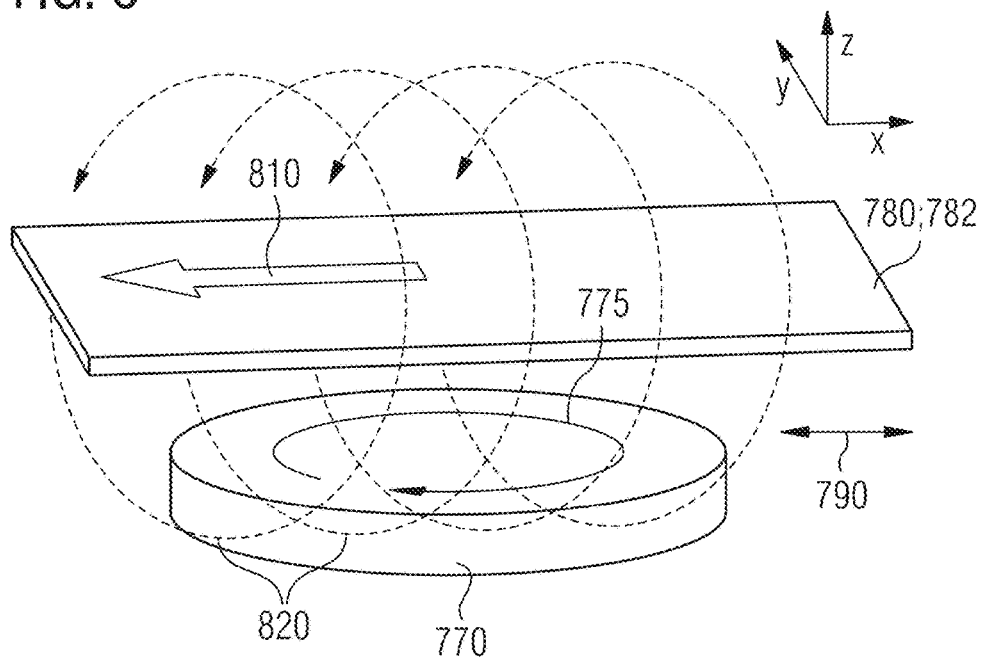
FIG. 8 shows an electrical conductor layer generating a magnetic field in a free layer according to an embodiment.

In an embodiment, which is shown in FIG. 8, magnetic biasing structure 780 comprises an electrical conductor 782, configured to generate, responsive to an electric current 810 in the electrical conductor 782, a magnetic field 820 in free layer 770 corresponding to the biasing field. Electrical conductor 782 may be implemented as a wire on-chip structure, or in other words, be integrated into a common layer stack together with free layer 770. Again, the preferred sensing direction 790 (comp. FIGS. 6A-6C) of the external magnetic field is parallel to the x-direction. Electrical conductor 782 may further be implemented as a metal layer parallel to free layer 770 and below or above free layer 770. Applying electric current 810 may give rise to an Oersted field having a vector component perpendicular to the external field or its preferred sensing direction 790, and primarily in-plane at the position of free layer 770. Thus, nucleation performance of the vortex state may be improved. Electrical conductor 782 may have the shape of a stripe. As a result, portions of magnetic field 820 penetrating free layer 770 may have a vector component in y-direction exceeding a value of a z-component. In other embodiments, electrical conductor 782 may be mounted separately from the magneto-resistive structure. Subsequent or supplementary mounting of magnetic biasing structure 780 onto a pre-fabricated magneto-resistive sensor device may therefore be possible. In other words, this embodiment may be implemented as an on-chip solution or an external solution. The person skilled in the art will appreciate, that further implementations beyond the scope of FIG. 8 may yield similar results. For example, electrical conductor 782 may be of cylindrical shape, having a cylindrical axis parallel to reference magnetization 755. Electrical conductor 782 may, additionally or alternatively, be detached from magneto-resistive structure 710. Optionally, an insulating means, e.g. additional layer, may be arranged between electrical conductor 782 and free layer 770.

Figure 9:
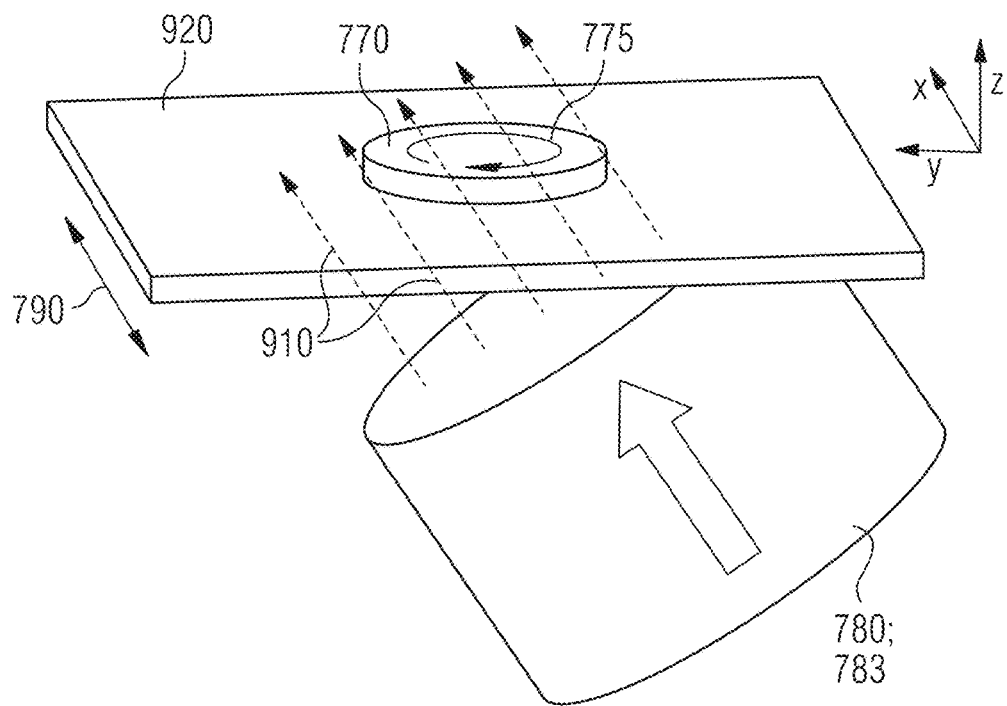
FIG. 9 shows a back bias magnet generating a magnetic field in a free layer according to an embodiment.

Turning to FIG. 9, in some embodiments, magnetic biasing structure 780 comprises one or more permanent magnets 783 or electromagnets configured to generate the biasing field in free layer 770. Magnetic biasing structure 780 may therein present an external solution which may not have to be implemented on silicon. Permanent magnet 783 in FIG. 9 is a back bias magnet, which is arranged in such a manner to provide a stray field 910 with a y-component at the position of the sensing vortex element or free layer 770. This may be realized for example by using a rotated permanent magnet 783 as shown in FIG. 9, or electromagnet. The influence of the z-component of resulting stray field 910 may be negligible for the sensor performance. Free layer 770 is mounted on a sensor chip 920, which may be comprised in magnetic sensor device 700 or magneto-resistive structure 710. For example, sensor chip 920 may correspond to a layer stack of magneto-resistive structure 710, or parts thereof. Though permanent magnet 783 in FIG. 9 is arranged below free layer 770 with one of its poles facing a direction having non-zero y- and z-components, the person skilled in the art having benefit from the disclosure will appreciate, that similar results may be obtained from different implementations. For example, in another embodiment, permanent magnet 783 may be replaced with an electromagnet. Further, permanent magnet 783 or the electromagnet may be arranged above free layer 770, or partially in a common plane with free layer 770. A pole of permanent magnet 783 may further face a direction having non-zero y- and z-components, or, optionally, a non-zero x-component. Strength of stray field 910 may be chosen or adjusted accordingly.

Figure 10:
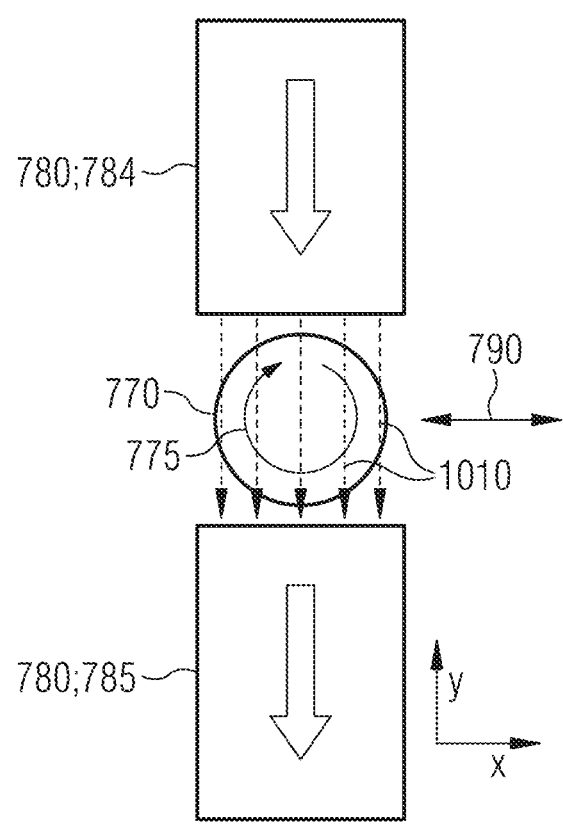
FIG. 10 shows two hard magnetic structures creating the biasing field in a free layer according to an embodiment.

In a further embodiment shown in FIG. 10, magnetic biasing structure 780 comprises at least a first permanent magnet 784 and a second permanent magnet 785 located on opposite sides of free layer 770. This may result in a more linear shape of the biasing field in comparison to an embodiment having one permanent magnet. First and second permanent magnets 784; 785 may form a hard magnetic layer in the vicinity of the soft magnetic free layer 770 and may create a stray field 1010 perpendicular to sensing direction 790. FIG. 10 shows a schematic of such a structure in plain view. Free layer 770 and first and second permanent magnets 784; 785 may be arranged at least partially in a common plane. Bold arrows indicate the respective orientations of first and second permanent magnets 784; 785, which may be parallel to each other. In other words, the north pole of first permanent magnet 784 may face the south pole of second permanent magnet 785, or vice versa. Preferred sensing direction 790 of the magnetic sensor device is again parallel to the x-axis. The respective magnetizations of first and second permanent magnets 784; 785 may further be parallel to the y-axis and thus create stray field 1010 that may improve vortex nucleation. The shape of the hard magnetic structures is however not restricted to a rectangle, which is merely exemplary in FIG. 10. Moreover, first and second permanent magnets 784; 785 may have a thickness in z-direction corresponding to the thickness of free layer 770, which may possibly facilitate an implementation as an on-chip solution. In another embodiment, first and second permanent magnets 784; 785 may just as well be arranged externally or outside the chip.

Figure 11:
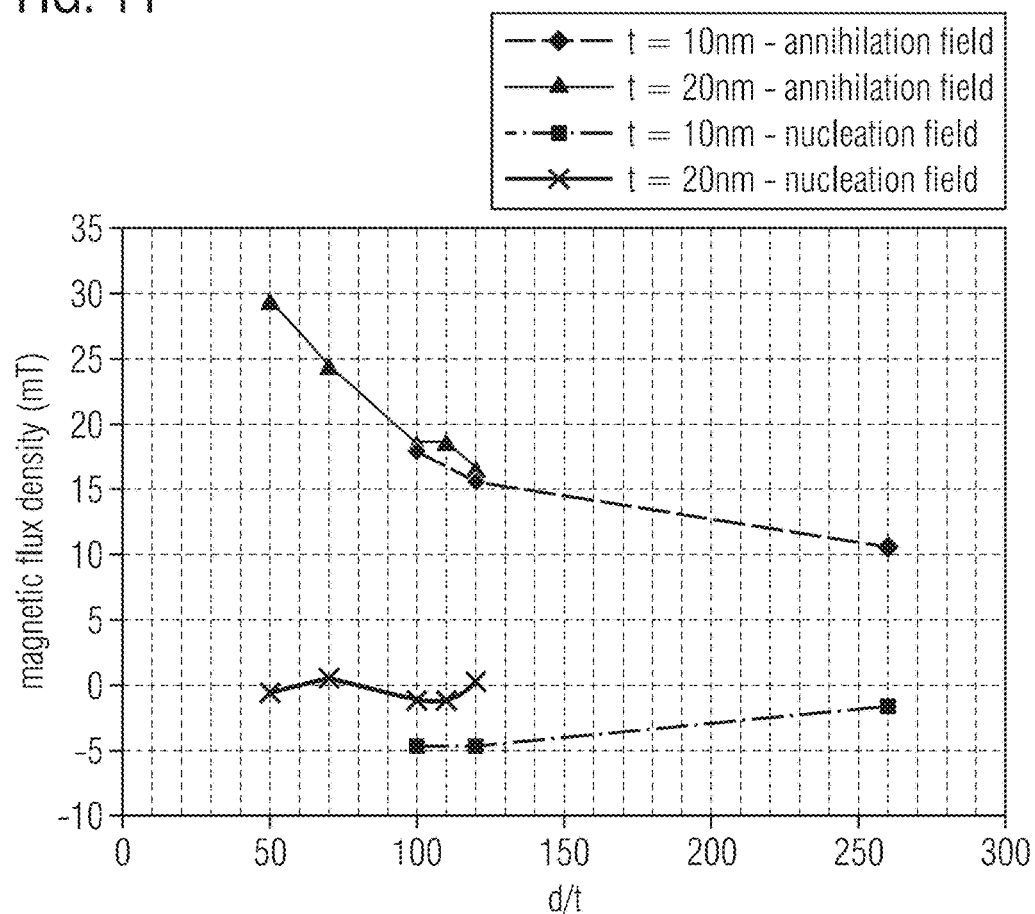
FIG. 11 shows a relationship between diameter-to-thickness ratio d/t of a free layer according to an embodiment and magnetic flux density in mT for a vortex nucleation field and a vortex annihilation field.

In some of the embodiments described above, nucleation field and annihilation field ($H_n$ and $H_{an}$, also comp. FIG. 2) may be influenced by the diameter-to-thickness ratio d/t of the free layer. The biasing field strength may in further embodiments be adjusted to a value such that the biasing field strength causes the nucleation field threshold to be larger in presence of the biasing field than in absence of the biasing field by at least 5 Oe, or preferably at least 10 Oe. FIG. 11 shows a relationship between diameter-to-thickness ratio d/t and magnetic flux density in mT for nucleation field and annihilation field. Triangles correspond to measurement values for the annihilation field, and crosses to measurement values for the nucleation field in a free layer with thickness t=20 nm. Diamonds correspond to measurement values for the annihilation field, and squares to measurement values for the nucleation field in a free layer with thickness t=10 nm.

Figure 12:
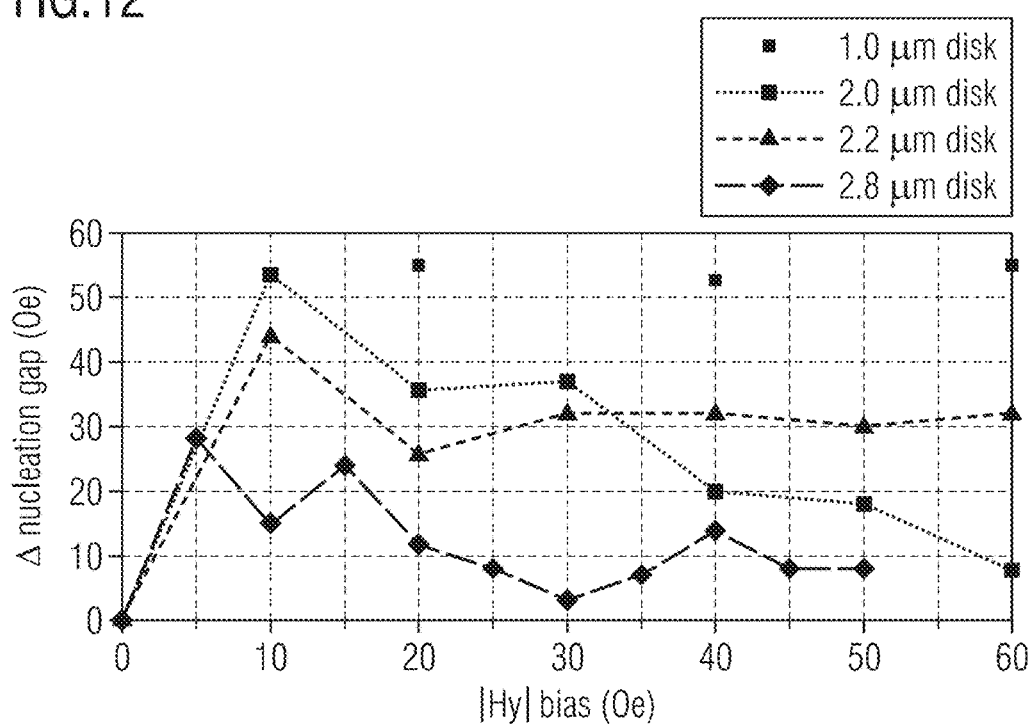
FIG. 12 shows a width increase of a vortex nucleation field range plotted against a biasing field strength for different diameters of free layers according to some embodiments.

For reasons of clarification, FIG. 12 shows a width increase of the vortex nucleation field range (comp. range 210 in FIG. 2) plotted against biasing field strength in y-direction for different disk diameters. Unconnected squares resemble a d=1.0 μm disk, squares connected by a dotted line resemble a d=2.0 μm disk, triangles connected by a dashed line resemble a d=2.2 μm disk, and diamonds connected by a dashed line resemble a d=2.8 μm disk. A biasing field of up to 60 Oe may have a considerable effect on the width of the vortex nucleation range. However, above 40 Oe this effect may decline in some cases. The effect may be largest for a 5 Oe or 10 Oe biasing field. An exemplary range of values of the biasing field strength may thus be between 1 Oe and 60 Oe, or even between 5 Oe and 20 Oe. The biasing field strength may, in some further embodiments, be at most 1/5 of the annihilation threshold for the external magnetic field at which the vortex pattern is annihilated.

Figure 13:
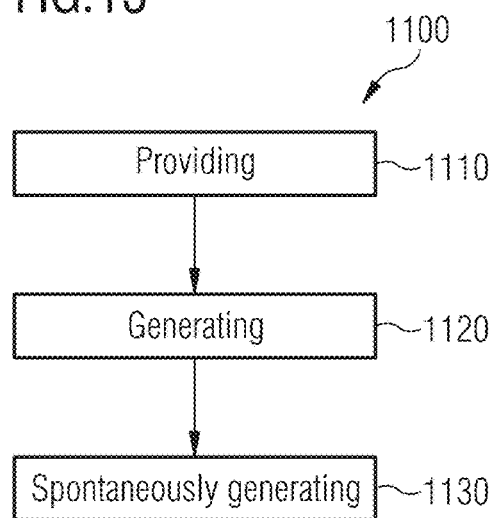
FIG. 13 shows a flow chart of a method for a magnetic sensor device according to an embodiment.

FIG. 13 shows a method 1100 for a magnetic sensor device having a magneto-resistive structure according to an embodiment. Method 1100 comprises providing 1110 a non-closed flux reference magnetization pattern in a magnetic reference layer of the magneto-resistive structure. Method 1100 also comprises generating 1120 a biasing field in a magnetic free layer of the magneto-resistive structure. The biasing field has a non-zero magnetic biasing field component perpendicular to the reference magnetization pattern. Optionally, the magnetic biasing field component may be an in-plane component. Method 1100 further comprises spontaneously generating 1130 a closed flux magnetization pattern in the magnetic free layer. A range of values of an external magnetic field to be measured, in which the vortex state is spontaneously generated, may thus be extended. In this range hysteresis may vanish, which in turn may increase reliability of the magnetic sensor device.

Embodiments described herein may relate to utilization of a substantially homogenous magnetic bias field, and may influence the vortex nucleation process in a magneto-resistive spin valve structure and thus may achieve a shift in vortex nucleation field. Embodiments may contribute to the realization of a vortex sensor, which shows less hysteresis compared to stripe or elliptical shaped magnetic microstructures. There is a similarity between homogenous biasing, when implemented via exchange bias, and the zero-field cooling, ZFC, process. Both are based on the exchange bias effect. However, the effect on the domain state may be different. Furthermore embodiments described here may be based on a changing external field, which may be unimportant for ZFC. Nevertheless, further embodiments may combine both and further increase and improve the nucleation field shift. For example, two field cooling procedures at different temperatures with and without magnetic field may be employed.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other example examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A magnetic sensor device, comprising:
   a magneto-resistive structure comprising a magnetic free layer configured to spontaneously generate a closed flux magnetization pattern in the magnetic free layer, and a magnetic reference layer having a non-closed flux reference magnetization pattern; and
   a magnetic biasing structure configured to generate an exchange biasing field in the magnetic free layer, the exchange biasing field having a non-zero magnetic biasing field component perpendicular to the reference magnetization pattern,
   the magnetic biasing structure including a biasing layer to generate the exchange biasing field,
   the biasing layer being arranged directly adjacent to the magnetic free layer.

2. The magnetic sensor device of claim 1, wherein the magnetic biasing structure is configured to generate the exchange biasing field having a non-zero magnetic biasing field component in-plane.

3. The magnetic sensor device of claim 1, wherein the magnetic biasing structure is configured to generate the exchange biasing field as a directionally fixed magnetic field.

4. The magnetic sensor device of claim 1, wherein the magnetic biasing structure is configured to generate the exchange biasing field in the magnetic free layer perpendicular to the reference magnetization pattern.

5. The magnetic sensor device of claim 1, wherein the magnetic free layer is of a centrally symmetric shape.

6. The magnetic sensor device of claim 1, wherein the magnetic free layer is of a rotationally symmetric shape.

7. The magnetic sensor device of claim 1, wherein a ratio between a thickness and a diameter of the magnetic free layer is in a range from 1/500 to 1/5.

8. The magnetic sensor device of claim 1, wherein the magnetic biasing structure is configured to generate the exchange biasing field with a biasing field strength causing a nucleation field threshold, at which the closed flux magnetization pattern is spontaneously generated, to be larger in presence of the exchange biasing field than in absence of the exchange biasing field.

9. The magnetic sensor device of claim 8, wherein the magnetic biasing structure is configured to generate the exchange biasing field with the biasing field strength causing the nucleation field threshold to be larger in presence of the exchange biasing field than in absence of the exchange biasing field by at least 5 Oe.

10. The magnetic sensor device of claim 1, wherein the magnetic biasing structure is configured to generate the exchange biasing field with a biasing field strength being at most 1/5 of an annihilation threshold for an external magnetic field, at which the closed flux magnetization pattern is annihilated.

11. The magnetic sensor device of claim 1, wherein the biasing layer is an antiferromagnetic layer to generate the exchange biasing field in the magnetic free layer.

12. The magnetic sensor device of claim 11, wherein the magnetic free layer is arranged between the antiferromagnetic layer and the magnetic reference layer.

13. The magnetic sensor device of claim 1, wherein the magnetic free layer includes at least one of iron, cobalt, or nickel.

14. The magnetic sensor device of claim 1, wherein the magnetic free layer has a thickness exceeding a thickness of the magnetic reference layer by at least a factor of 3.

15. The magnetic sensor device of claim 1, wherein the magneto-resistive structure corresponds to a giant magneto-resistive, GMR, structure or a tunnel magneto-resistive, TMR, structure.

16. A magneto-resistive sensor element, comprising:
a magnetic free layer configured to spontaneously generate a vortex magnetization pattern in the magnetic free layer, and a magnetic reference layer having a linear reference magnetization pattern; and
a magnetic biasing structure configured to generate a directionally fixed exchange biasing field in the magnetic free layer and perpendicular to the linear reference magnetization pattern,
the magnetic biasing structure including a biasing layer to generate the directionally fixed exchange biasing field,
the biasing layer being arranged directly adjacent to the magnetic free layer.

17. The magneto-resistive sensor element of claim 16, wherein the magnetic biasing structure is configured to generate the exchange biasing field with a biasing field strength in a range from 1 Oe to 60 Oe.

18. A method for a magnetic sensor device having a magneto-resistive structure, the method comprising:
providing a non-closed flux reference magnetization pattern in a magnetic reference layer of the magneto-resistive structure;
generating, by a biasing layer of a magnetic biasing structure, an exchange biasing field in a magnetic free layer of the magneto-resistive structure, the exchange biasing field having a non-zero magnetic biasing field component perpendicular to the reference magnetization pattern;
the biasing layer being arranged directly adjacent to the magnetic free layer; and
spontaneously generating a closed flux magnetization pattern in the magnetic free layer.

* * * * *